United States Patent
Cho et al.

(10) Patent No.: US 9,209,764 B2
(45) Date of Patent: Dec. 8, 2015

(54) SMALL SIGNAL RECEIVER AND INTEGRATED CIRCUIT INCLUDING THE SAME

(71) Applicant: SAMSUNG ELECTRONICS CO., LTD., Suwon-si, Gyeonggi-do (KR)

(72) Inventors: Young Chul Cho, Hwaseong-si (KR); Yong Cheol Bae, Hwaseong-si (KR); Yoon Joo Eom, Hwaseong-si (KR); Young Jin Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 13/841,199

(22) Filed: Mar. 15, 2013

(65) Prior Publication Data

US 2014/0003162 A1    Jan. 2, 2014

(30) Foreign Application Priority Data

Jun. 27, 2012 (KR) .......................... 10-2012-0069453

(51) Int. Cl.
*G11C 7/10* (2006.01)
*H03F 3/45* (2006.01)
*G11C 7/06* (2006.01)

(52) U.S. Cl.
CPC .............. *H03F 3/45179* (2013.01); *G11C 7/06* (2013.01); *G11C 7/10* (2013.01); *G11C 7/1084* (2013.01); *H03F 3/45237* (2013.01); *H03F 3/45672* (2013.01); *H03F 2203/45296* (2013.01); *H03F 2203/45316* (2013.01); *H03F 2203/45328* (2013.01); *H03F 2203/45358* (2013.01);

(Continued)

(58) Field of Classification Search
CPC .......... G11C 7/10; G11C 7/1084; G11C 7/06; G11C 7/062; H03F 3/45179; H03F 3/45237; H03F 3/45672; H03F 2203/45296; H03F 2203/45316; H03F 2203/45328; H03F 2203/45358; H03F 2203/45431; H03F 2203/45506
USPC .................... 365/189.05, 189.07, 205, 207
See application file for complete search history.

(56) References Cited

U.S. PATENT DOCUMENTS 4,223,624 A * 9/1980 Iyeta ........................ 114/144 E
4,763,026 A * 8/1988 Tsen et al. ..................... 327/56

(Continued)

OTHER PUBLICATIONS

James Karki, Fully-Differential Amplifiers, Texas Instruments, Jan. 2002.*

(Continued)

*Primary Examiner* — Tan T Nguyen
(74) *Attorney, Agent, or Firm* — F. Chau & Associates, LLC

(57) ABSTRACT

A small signal receiver includes a first current adjustment circuit connected between a first power supply voltage terminal and a first node to provide current in response to a self-bias signal, a self-biased differential amplifier connected between the first node and a second node to compare an input signal with a reference voltage, provide the self-bias signal to a self-biasing node and output an output signal through an output node, and a second current adjustment circuit connected between the second node and a second power supply voltage terminal to sink current at the second node in response to the self-bias signal. The self-biased differential amplifier includes a swing stabilizing block connected between an input node to which the input signal is applied and the self-biasing node to stabilize the input signal compared with the reference voltage.

13 Claims, 12 Drawing Sheets

(52) U.S. Cl.
CPC ............... *H03F2203/45372* (2013.01); *H03F 2203/45431* (2013.01); *H03F 2203/45506* (2013.01)

(56) References Cited

U.S. PATENT DOCUMENTS

| | | | | |
|---|---|---|---|---|
| 5,293,515 | A * | 3/1994 | Uchida et al. | 327/51 |
| 5,528,544 | A * | 6/1996 | Kohno | 365/207 |
| 6,044,036 | A * | 3/2000 | Flannagan et al. | 365/230.08 |
| 6,087,896 | A * | 7/2000 | Bazzani | 327/581 |
| 6,107,882 | A | 8/2000 | Gabara et al. | |
| 6,304,141 | B1 * | 10/2001 | Kennedy et al. | 330/253 |
| 7,151,400 | B2 | 12/2006 | Chen | |
| 2005/0140442 | A1 | 6/2005 | Tan | |
| 2005/0200411 | A1 | 9/2005 | Chang et al. | |
| 2008/0163684 | A1 * | 7/2008 | Kurihara | 73/504.12 |
| 2010/0127746 | A1 * | 5/2010 | Lewison | 327/261 |
| 2011/0096611 | A1 * | 4/2011 | Lee et al. | 365/189.07 |
| 2012/0092069 | A1 * | 4/2012 | McLeod | 330/253 |

OTHER PUBLICATIONS

Custodio et. al., A CMOS Inverter-Based Self-biased Fully Differential Amplifier, IFIP Advances in Information and Communication Technology vol. 314, 2010, pp. 541-548.*

Mel Bazes, Two Novel Fully Complementary Self-Biases CMOS Differential Amplifiers, IEEE Jounrla of Sold-State Cicuits, vol. 26, Feb. 1991.*

Towers, "High Input-Impedance Amplifier Circuits", Wireless World, Jul. 1968, pp. 197-201.*

* cited by examiner

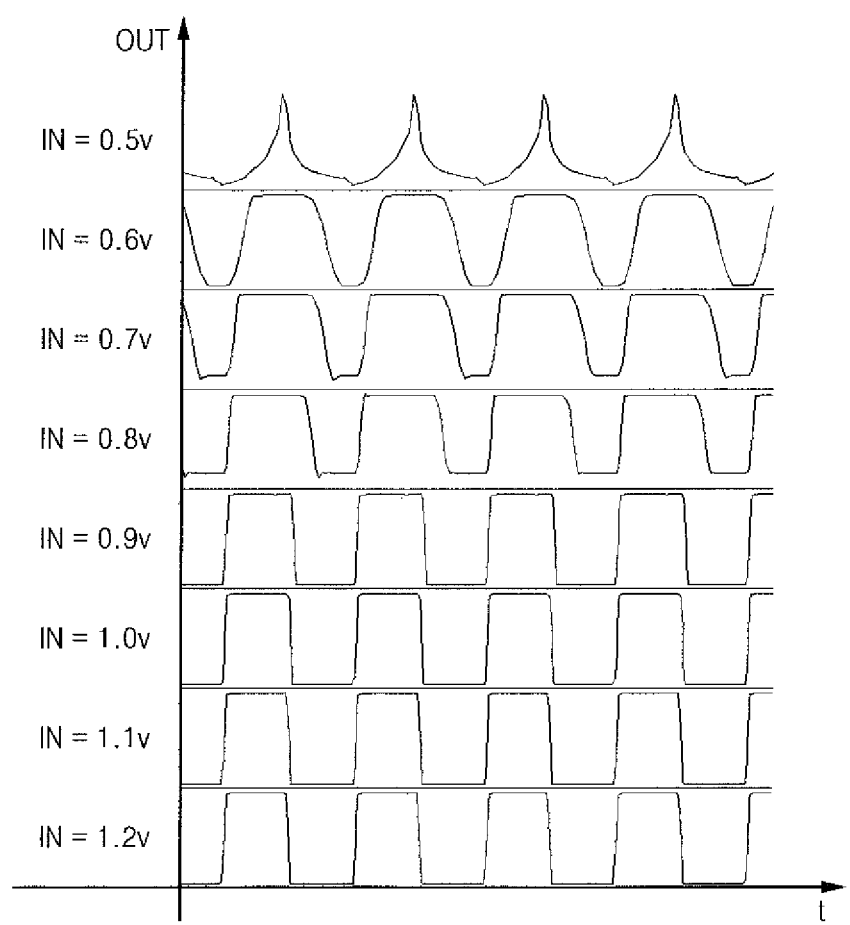

SMALL SIGNAL RECEIVER AND INTEGRATED CIRCUIT INCLUDING THE SAME

CROSS-REFERENCE TO RELATED APPLICATIONS

This application claims priority under 35 U.S.C. §119(a) to Korean Patent Application No. 10-2012-0069453 filed on Jun. 27, 2012, the disclosure of which is incorporated by reference in its entirety herein.

BACKGROUND

1. Technical Field

Embodiments of the inventive concept relate to a small signal receiver, and more particularly, to a small signal receiver including a self-biased differential amplifier.

2. Discussion of Related Art

Some systems use a transistor-transistor logic (TTL) interface for high-speed communication or compatibility with other systems rather than a complementary metal oxide semiconductor (CMOS) interface. However, since CMOS processes are used in manufacturing semiconductor integrated circuits (ICs), a TTL-to-CMOS interface is widely used. Accordingly, a CMOS IC may use a small signal receiver to convert a TTL voltage level into a CMOS voltage level.

As semiconductor devices operating at a low power supply voltages have become more common, various small signal receivers have been developed. Of those small signal receivers, a self-biased differential amplifier may be used in mobile devices for which low voltage and low power consumption is important. A self-biased differential amplifier receives a reference voltage and an input voltage, compares them with each other, and outputs a comparison result. The self-biased differential amplifier has a complementary form, can use active-biasing, is less sensitive to processes, temperature and power supply voltages due to a self-bias characteristic given by negative feedback, and can provide a switch current relatively greater than a quiescent bias current.

However, as semiconductor devices get smaller and require lower power, self-biased differential amplifiers may not provide output signals reliably at a low input voltage.

SUMMARY

According to an exemplary embodiment of the inventive concept, a small signal receiver includes a first current adjustment circuit configured to be connected between a first power supply voltage terminal and a first node and to provide current in response to a self-bias signal, a self-biased differential amplifier configured to be connected between the first node and a second node, to compare an input signal with a reference voltage, to provide the self-bias signal to a self-biasing node, and to output an output signal through an output node, and a second current adjustment circuit configured to be connected between the second node and a second power supply voltage terminal and to sink current at the second node in response to the self-bias signal. The differential amplifier may be an operational amplifier.

The self-biased differential amplifier includes a swing stabilizing block configured to be connected between an input node to which the input signal is applied and the self-biasing node and to stabilize the input signal compared with the reference voltage.

The self-biased differential amplifier may further include a first P-type metal oxide semiconductor (PMOS) transistor configured to be connected between the first node and the self-biasing node and to be gated with the reference voltage applied to a reference node, a second PMOS transistor configured to be connected between the first node and the output node and to be gated with the input signal, a first N-type metal oxide semiconductor (NMOS) transistor configured to be connected between the second node and the self-biasing node and to be gated with the reference voltage applied to the reference node, and a second NMOS transistor configured to be connected between the second node and the output node and to be gated with the input signal.

According to an exemplary embodiment of the inventive concept, an integrated circuit includes a first PMOS transistor configured to be connected between a first power supply voltage terminal and a first node and to provide current in response to a self-bias signal, a self-biased differential amplifier configured to be connected between the first node and a second node, to compare an input signal with a reference voltage, to provide the self-bias signal to a self-biasing node, and to output an output signal through an output node, and a first NMOS transistor configured to be connected between the second node and a second power supply voltage terminal and to sink current at the second node in response to the self-bias signal. The differential amplifier may be an operational amplifier. A memory device may include a control logic configured to output a row address, a column address, and at least one control signal in response to a plurality of signals; a memory cell array comprising a plurality of word lines, a plurality of bit lines and a plurality of memory cells each of which is connected to one of the word lines and one of the bit lines and stores data; a row decoder configured to decode the row address and to select one of the word lines; a column decoder configured to decode the column address and to select at least one of the bit lines; a sense amplifier configured to sense and amplify data received from at least one of the memory cells connected between the selected word line and the selected bit line or data to be stored in the memory cell; the integrated circuit configured to input or output the data; an input buffer configured to receive the data to be stored in the memory cell and to transmit the data to the integrated circuit; and an output driver configured to receive the sensed and amplified data from the integrated circuit and to output the sensed and amplified data.

The self-biased differential amplifier includes a plurality of PMOS transistors connected in parallel between the first node and the self-biasing node, a plurality of NMOS transistors connected in parallel between the second node and the self-biasing node, and a swing stabilizing block configured to be connected between an input node to which the input signal is applied and the self-biasing node, to convert the input signal, and to provide the converted input signal to the self-biasing node.

According to an exemplary embodiment of the inventive concept, a small signal receiver includes a first transistor connected between a power supply voltage and a first node, a first complimentary transistor connected between a ground voltage and a second node, a second transistor connected between the first node and a third node, a third transistor connected between the first node and a fourth node, a second complimentary transistor connected between the third node and the second node and including a control terminal connected to a control terminal of the second transistor, a third complimentary transistor connected between the fourth node and the second node and including a control terminal connected to a control terminal of the third transistor, and a swing stabilizing block connected between the third node and the control terminal of the third transistor.

BRIEF DESCRIPTION OF THE DRAWINGS

The inventive concept will become more apparent by describing in detail exemplary embodiments thereof with reference to the attached drawings in which:

FIG. 10 is a graph showing an output signal against an input voltage in a small signal receiver according to an exemplary embodiment of the inventive concept;

DETAILED DESCRIPTION

Figure 1:
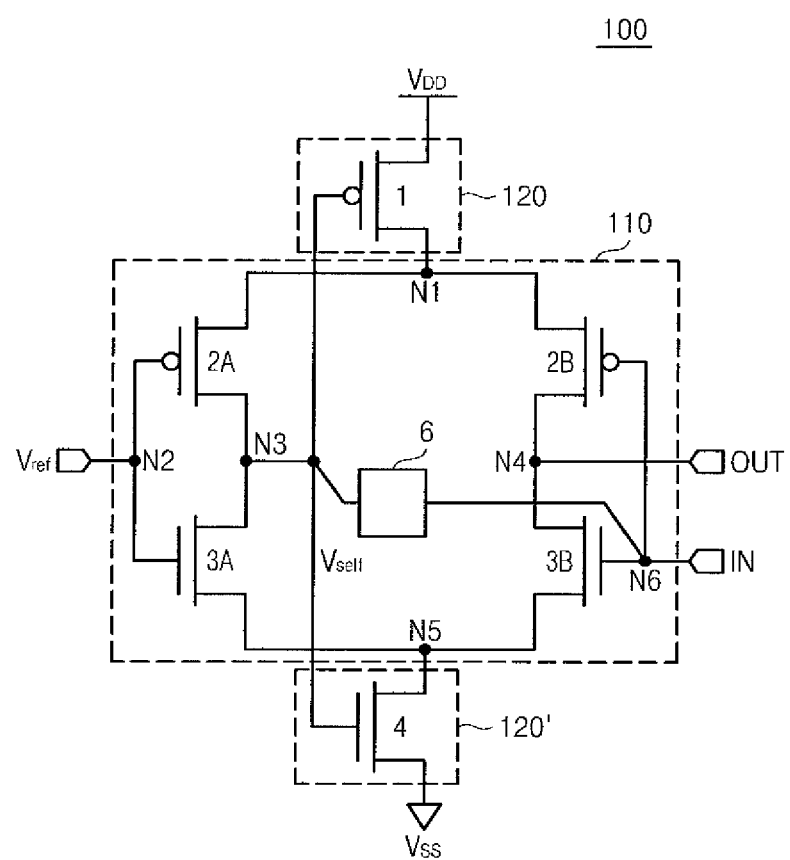
FIG. 1 is a circuit diagram of a small signal receiver according to an exemplary embodiment of the inventive concept.

The inventive concept will now be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise.

FIG. 1 is a circuit diagram of a small signal receiver 100 according to an exemplary embodiment of the inventive concept. The small signal receiver 100 includes a differential amplifier 110 and current adjustment circuits 120 and 120'.

The differential amplifier circuit 110 is a self-biased differential amplifier. The differential amplifier circuit 110 is connected between a first node N1 and a second node N5, provides a self-bias signal $V_{self}$ to a self-biasing node N3 based on a voltage difference between a reference voltage $V_{ref}$ and an input signal IN, and outputs an output signal OUT from an output node N4. In an exemplary embodiment of the inventive concept, the reference voltage $V_{ref}$ is replaced with an inverse reference voltage (i.e., INB) having a phase inverse to the phase of the input signal IN. However, in an exemplary embodiment of the inventive concept described below, the reference voltage $V_{ref}$ having the same phase as the input signal IN is used. In an exemplary embodiment, the differential amplifier circuit 110 is a combination of a P-type differential amplifier and an N-type differential amplifier. The differential amplifier circuit 110 includes first and second P-type metal oxide semiconductor (PMOS) transistors 2A and 2B and first and second N-type MOS (NMOS) transistors 3A and 3B.

The first PMOS transistor 2A is connected between the first node N1 and the self-biasing node N3 and is gated with the reference voltage $V_{ref}$ applied to a reference node N2. The second PMOS transistor 2B is connected between the first node N1 and the output node N4 and is gated with the input signal IN.

The first NMOS transistor 3A is connected between the second node N5 and the self-biasing node N3 and is gated with the reference voltage $V_{ref}$ applied to the reference node N2. The second NMOS transistor 3B is connected between the second node N5 and the output node N4 and is gated with the input signal IN applied to an input node N6.

The current adjustment circuits 120 and 120' provide current to the differential amplifier circuit 110 in response to the self-bias signal $V_{self}$ and sink current from the differential amplifier circuit 110, so that the voltage level of the self-bias signal $V_{self}$ from the self-biasing node N3 is maintained at or near a constant level.

The first current adjustment circuit 120 may be a current source 120 including a PMOS transistor 1. The PMOS transistor 1 is connected between a power supply voltage terminal $V_{DD}$ and the first node N1 and provides current to the differential amplifier circuit 110 in response to the self-bias signal $V_{self}$ applied to its gate. The second current adjustment circuit 120' may be a current sink 120' including an NMOS transistor 4. The NMOS transistor 4 is connected between the second node N5 and a ground voltage terminal $V_{SS}$ and sinks the current from the differential amplifier circuit 110 in response to the self-bias signal $V_{self}$ applied to its gate.

The self-bias signal $V_{self}$ output from the self-biasing node N3 is used to track a common mode input voltage in the differential amplifier circuit 110 and is also used to adjust current in the current adjustment circuits 120 and 120'. Accordingly, the voltage level of the self-bias signal $V_{self}$ output from the self-biasing node N3 can be maintained at or near a constant voltage level in the small signal receiver 100. When the self-bias signal $V_{self}$ of the small signal receiver 100 has a constant voltage level, the total transconductance gain of the differential amplifier circuit 110 is constant regardless of the change in the reference voltage $V_{ref}$ and a low-voltage interface characteristic may be enhanced.

A swing stabilizing block 6 is connected between the input node N6 and the self-biasing node N3 to stably provide a low-voltage input signal from the input node N6 to the self-biasing node N3. In other words, even when an unstable low voltage is applied as an input signal to the input node N6, the swing stabilizing block 6 stabilizes the input signal before providing it to the self-biasing node N3, so that the low-voltage interface characteristic of the differential amplifier circuit 110 may be improved.

The swing stabilizing block 6 may be implemented in various ways, for example, by using a passive element, such as a resistor, a capacitor, or an inductor or an active element, such as a transistor or a diode. In an exemplary embodiment, the passive element performs at least one of consuming, accumulating, or discharging of a charge. In an exemplary embodiment, the active element receives a signal with a low voltage and outputs a signal with a high voltage. When the swing stabilizing block 6 is implemented by at least one NMOS transistor, the transistor may be gated with the input signal IN at the input node N6 and a drain and source of the transistor may be connected in common to the self-biasing node N3. When the swing stabilizing block 16 is implemented by at least one PMOS transistor, the transistor may be gated with the self-bias signal $V_{self}$ and a drain and source of the transistor may be connected in common to the input node N6.

Figure 2:
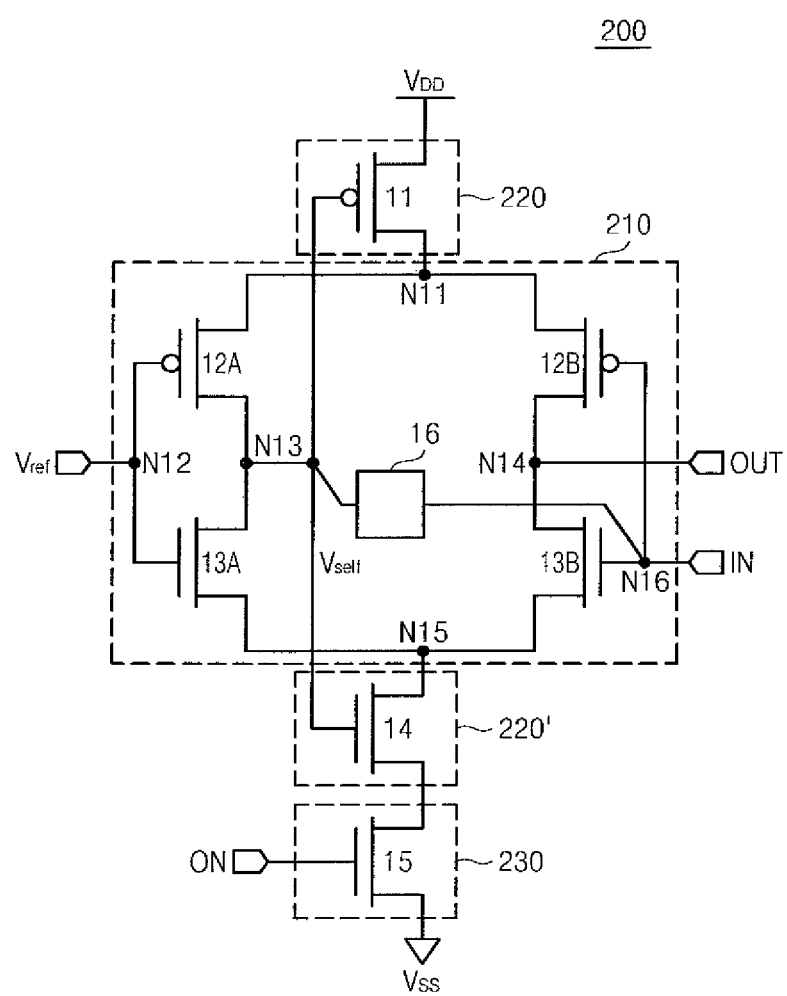
FIG. 2 is a circuit diagram of a small signal receiver according to an exemplary embodiment of the inventive concept.

FIG. 2 is a circuit diagram of a small signal receiver 200 according to an exemplary embodiment of the inventive concept. Referring to FIG. 2, the small signal receiver 200 includes a differential amplifier 210, current adjustment circuits 220 and 220', and a switch circuit 230.

The differential amplifier circuit 210 is a self-biased differential amplifier. The differential amplifier circuit 210 is connected between a first node N11 and a second node N15, provides a self-bias signal $V_{self}$ to a self-biasing node N13 based on a voltage difference between a reference voltage $V_{ref}$ and an input signal IN, and outputs an output signal OUT from an output node N14. In an exemplary embodiment of the inventive concept, the reference voltage $V_{ref}$ is replaced with an inverse reference voltage (i.e., INB) having a phase inverse to the phase of the input signal IN. However, in an exemplary embodiment of the inventive concept described below, the reference voltage $V_{ref}$ having the same phase as the input signal IN is used. In an exemplary embodiment, the differential amplifier circuit 210 is a combination of a P-type differential amplifier and an N-type differential amplifier. The differential amplifier circuit 110 includes first and second PMOS transistors 12A and 12B and first and second NMOS transistors 13A and 13B.

The first PMOS transistor 12A is connected between the first node N11 and the self-biasing node N13 and is gated with the reference voltage $V_{ref}$ applied to a reference node N12. The second PMOS transistor 12B is connected between the first node N11 and the output node N14 and is gated with the input signal IN applied to an input node N16.

The first NMOS transistor 13A is connected between the second node N15 and the self-biasing node N13 and is gated with the reference voltage $V_{ref}$ applied to the reference node N12. The second NMOS transistor 13B is connected between the second node N15 and the output node N14 and is gated with the input signal IN applied to the input node N16.

The current adjustment circuits 220 and 220' provide current to the differential amplifier circuit 210 in response to the self-bias signal $V_{self}$ and sink current from the differential amplifier circuit 210, so that the voltage level of the self-bias signal $V_{self}$ from the self-biasing node N13 is maintained at or near a constant level.

The first current adjustment circuit 220 may include a PMOS transistor 11. The PMOS transistor 11 is connected between a power supply voltage terminal $V_{DD}$ and the first node N11 and provides current to the differential amplifier circuit 210 in response to the self-bias signal $V_{self}$ applied to its gate. The second current adjustment circuit 220' may include an NMOS transistor 14. The NMOS transistor 14 is connected between the second node N15 and a ground voltage terminal $V_{SS}$ and sinks the current from the differential amplifier circuit 210 in response to the self-bias signal $V_{self}$ applied to its gate.

The switching circuit 230 may turn on or off the small signal receiver 200 in response to an on/off signal ON. Although the switching circuit 230 is implemented by a transistor in FIG. 2, it may be implemented by a switch or other similar device in other embodiments.

The small signal receiver 200 also includes a swing stabilizing block 16. The swing stabilizing block 16 is connected between the input node N16 and the self-biasing node N13. Although the swing stabilizing block 16 is illustrated as a box in FIG. 2, it may be implemented in various ways, for example, by using a passive element, such as a resistor, a capacitor, or an inductor or an active element, such as a transistor or a diode. In an exemplary embodiment, the passive element performs at least one of consuming, accumulating, or discharging of a charge. In an exemplary embodiment, the active element receives a signal of a low voltage and outputs a signal of a high voltage.

For example, when the swing stabilizing block 16 is implemented by at least one NMOS transistor, the transistor may be gated with the input signal IN at the input node N16 and a drain and source of the transistor may be connected in common to the self-biasing node N13. When the swing stabilizing block 16 is implemented by at least one PMOS transistor, the transistor may be gated with the self-bias signal $V_{self}$ and a drain and source of the transistor may be connected in common to the input node N16.

Figure 3:
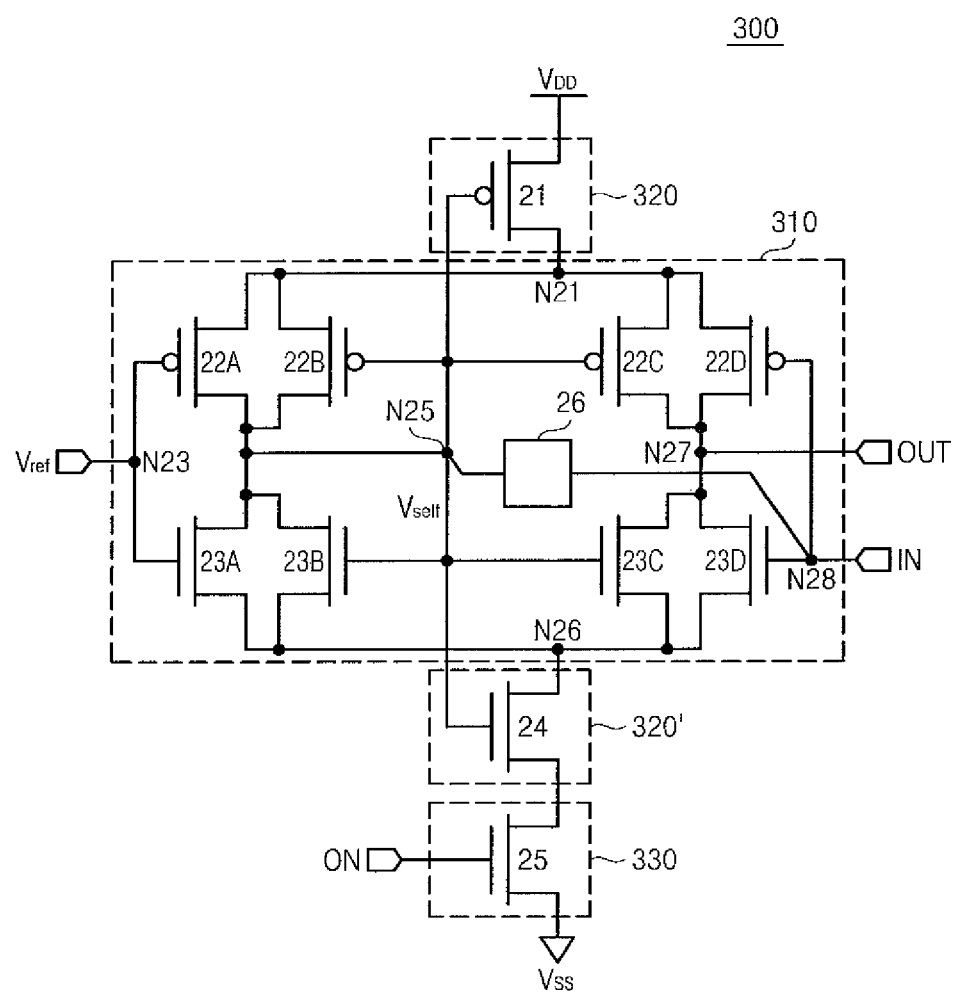
FIG. 3 is a circuit diagram of a small signal receiver according to an exemplary embodiment of the inventive concept.

FIG. 3 is a circuit diagram of a small signal receiver 300 according to an exemplary embodiment of the inventive concept. Referring to FIG. 3, the small signal receiver 300 includes a differential amplifier 310, current adjustment circuits 320 and 320', and a switch circuit 330.

The differential amplifier circuit 310 is a self-biased differential amplifier. The self-biased differential amplifier 310 is connected between a first node N21 and a second node N26, provides a self-bias signal $V_{self}$ to a self-biasing node N25 based on a voltage difference between a reference voltage $V_{ref}$ and an input signal IN, and outputs an output signal OUT from an output node N27. In an exemplary embodiment of the inventive concept, the reference voltage $V_{ref}$ is replaced with an inverse reference voltage (i.e., INB) having a phase inverse to the phase of the input signal IN. However, in an exemplary embodiment of the inventive concept described below, the reference voltage $V_{ref}$ having the same phase as the input signal IN is used. In an exemplary embodiment, the self-biased differential amplifier 310 is a combination of a P-type differential amplifier and an N-type differential amplifier. The self-biased differential amplifier 310 includes first through fourth PMOS transistors 22A, 22B, 22C, and 22D and first through fourth NMOS transistors 23A, 23B, 23C, and 23D.

The first PMOS transistor 22A is connected between the first node N21 and the self-biasing node N25 and is gated with the reference voltage $V_{ref}$ applied to a reference node N23. The second PMOS transistor 22B is connected between the first node N21 and the self-biasing node N25 in parallel with the first PMOS transistor 22A and is gated with a signal output from the self-biasing node N25, i.e., the self-bias signal $V_{self}$. The third PMOS transistor 22C is connected between the first node N21 and the output node N27 and is gated with the self-bias signal $V_{self}$. The fourth PMOS transistor 22D is connected between the first node N21 and the output node N27 in parallel with the third PMOS transistor 22C and is gated with the input signal IN received from an input node N28.

The first NMOS transistor 23A is connected between the second node N26 and the self-biasing node N25 and is gated with the reference voltage $V_{ref}$ applied to the reference node N23. The second NMOS transistor 23B is connected between the second node N26 and the self-biasing node N25 in parallel with the first NMOS transistor 23A and is gated with the signal output from the self-biasing node N25. The third NMOS transistor 23C is connected between the second node N26 and the output node N27 and is gated with the self-bias signal $V_{self}$. The fourth NMOS transistor 23D is connected between the second node N26 and the output node N27 in parallel with the third NMOS transistor 23C and is gated with the input signal IN received from the input node N28.

The current adjustment circuits 320 and 320' provide current to the self-biased differential amplifier 310 in response to the self-bias signal $V_{self}$ and sink current from the self-biased differential amplifier 310, so that the voltage level of the self-bias signal $V_{self}$ from the self-biasing node N25 is maintained at or near a constant level.

The self-bias signal $V_{self}$ at the self-biasing node N25 is used to track a common mode input voltage in the self-biased differential amplifier 310 and is also used to adjust current in the current adjustment circuits 320 and 320'. Accordingly, the voltage level of the self-bias signal $V_{self}$ can be maintained at or near a constant level in the small signal receiver 300. As a result, the self-bias signal $V_{self}$ may be constant regardless of the change in the reference voltage $V_{ref}$ and a low-voltage interface characteristic may be enhanced.

The switching circuit 330 may turn on or off the small signal receiver 300 in response to an on/off signal ON. Although the switching circuit 330 is implemented by a transistor in FIG. 3, it may be implemented by a switch or a similar device in other embodiments.

The small signal receiver 300 also includes a swing stabilizing block 26. The swing stabilizing block 26 is connected between the input node N28 and the self-biasing node N25. Although the swing stabilizing block 26 is illustrated as a box in FIG. 3, it may be implemented in various ways, for example, by using a passive element, such as a resistor, a capacitor, or an inductor or an active element, such as a transistor or a diode. In an exemplary embodiment, the passive element performs at least one of consuming, accumulating, or discharging of a charge. In an exemplary embodiment, the active element receives a signal with a low voltage and outputs a signal with a high voltage.

For example, when the swing stabilizing block 26 is implemented by at least one NMOS transistor, the transistor may be gated with the input signal IN at the input node N28 and a drain and source of the transistor may be connected in common to the self-biasing node N25. When the swing stabilizing block 26 is implemented by at least one PMOS transistor, the transistor may be gated with the self-bias signal $V_{self}$ and a drain and source of the transistor may be connected in common to the input node N28.

Figure 4:
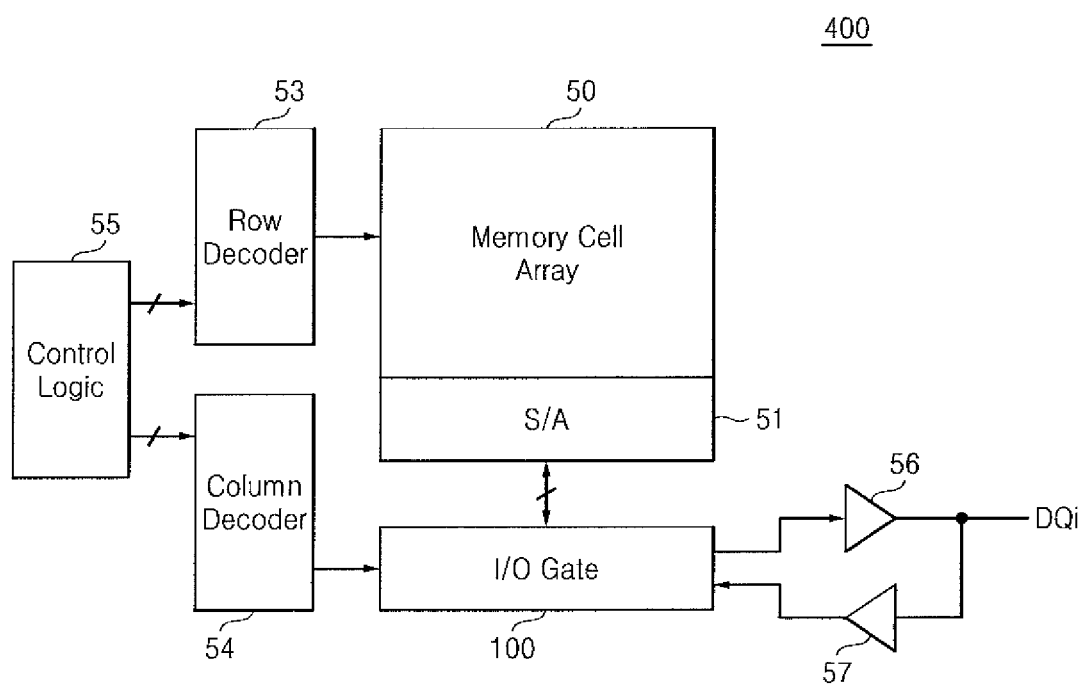
FIG. 4 is a block diagram of a memory device including a small signal receiver according to an exemplary embodiment of the inventive concept.

FIG. 4 is a block diagram of a memory device 400 including a small signal receiver according to an exemplary embodiment of the inventive concept. Referring to FIG. 4, the memory device 400 includes a control logic 55, a row decoder 53, a column decoder 54, a memory cell array 50, a sense amplifier (S/A) 51, an input/output (I/O) gate 100, an input buffer 57, and an output driver (buffer) 56.

The control logic 55 controls the row decoder 53, column decoder 54, and output driver 56 in response to a plurality of signals. The row decoder 53 decodes a row address output from the control logic 55 and selects one of a plurality of rows (or word lines) according to a decoding result.

Although only one memory cell array 50 is illustrated in FIG. 4, a plurality of memory cell arrays or a plurality of banks including a memory cell array may be implemented in other embodiments. The memory cell array 50 includes a plurality of rows (or word lines), a plurality of columns (or bit lines), and a plurality of memory cells for storing data. The S/A 51 senses and amplifies the change in a voltage of each bit line.

The column decoder 54 decodes a column address output from the control logic 55 and outputs a plurality of column selection signals to the I/O gate 100 according to a decoding result. The I/O gate 100 transceives data or signals between the S/A 51 and the output driver 56 or the input buffer 57 in response to the column selection signals output from the column decoder 54.

During a write operation, the I/O gate 100 transmits data DQi (where "i" is a natural number) received from the input buffer 57 to the memory cell array 50 through a driver (not shown) in response to a plurality of column selection signals output from the column decoder 54. During a read operation, the I/O gate 100 transmits a plurality of signals sensed and amplified by the S/A 51 to the output driver 56 as data in response to a plurality of column selection signals output from the column decoder 54.

Figure 5:
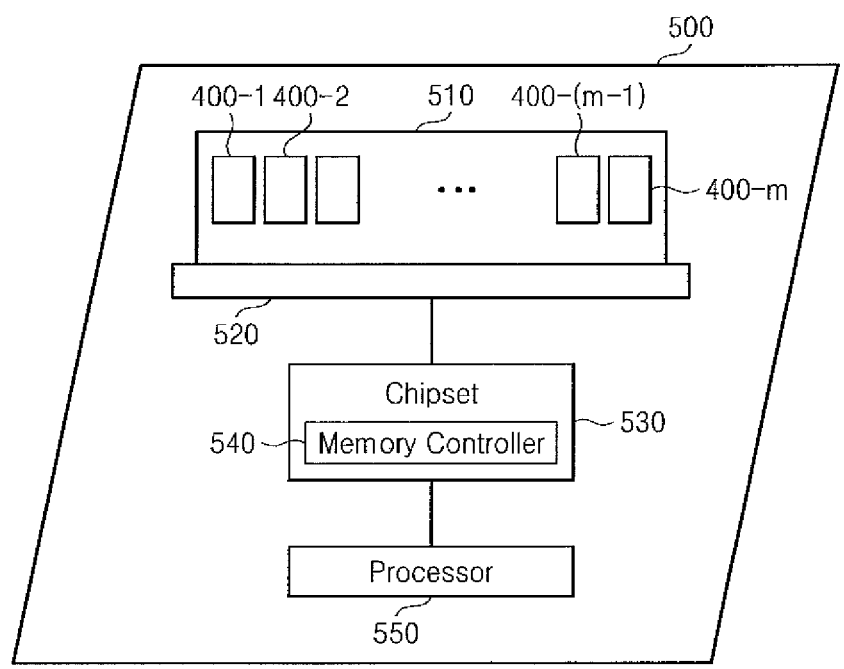
FIG. 5 is a block diagram of a memory system including a small signal receiver according to an exemplary embodiment of the inventive concept.

FIG. 5 is a block diagram of a memory system 500 including a small signal receiver according to an exemplary embodiment of the inventive concept. Referring to FIGS. 4 and 5, the memory system 500 may be implemented as a personal computer (PC), a tablet PC, or a mobile computing device. The memory system 500 includes a main board, a slot 520 mounted on the main board, a memory module 510 inserted into the slot 520, a chipset 530 that controls the operation of memory devices 400-1 through 400-m installed in the memory module 510 via the slot 520, and a processor 550 that communicates with the memory devices 400-1 through 400-m. Each of the memory devices 400-1 through 400-m may be the memory device 400 illustrated in FIG. 4.

For clarity of the description, only one memory module 510 is illustrated in FIG. 5, but the memory system 500 may include one or more memory modules. The chipset 530 is used for transmission of data, addresses, or control signals between the processor 550 and the memory module 510. The chipset 530 includes the memory controller 540. In an exemplary embodiment, the memory controller 540 is located in the processor 550.

Figure 6:
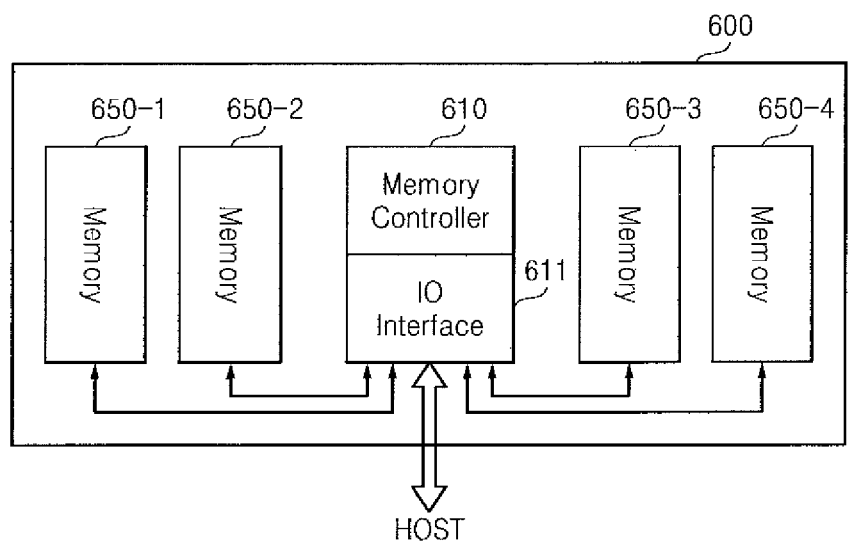
FIG. 6 is a block diagram of a module including a plurality of memory devices according to an exemplary embodiment of the inventive concept.

FIG. 6 is a block diagram of a module 600 including a plurality of memory devices 650-1 through 650-4 according to an exemplary embodiment of the inventive concept. Referring to FIG. 6, the module 600 may include a memory controller 610, an I/O interface 611, and the memory devices 650-1 through 650-4. The memory controller 610 and the I/O interface 611 may be implemented separately from the memory devices 650-1 through 650-4 and may communicate with a host.

The memory controller 610 and the I/O interface 611 may be integrated into a single chip. The memory devices 650-1 through 650-4 may communicate data with the host through the chip.

Figure 7:
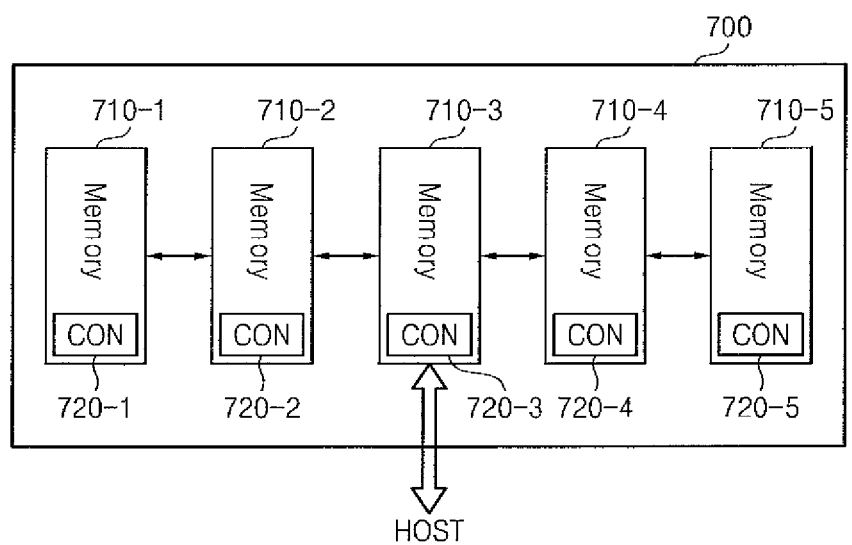
FIG. 7 is a block diagram of a module including a plurality of memory devices according to an exemplary embodiment of the inventive concept.

FIG. 7 is a block diagram of a module 700 including a plurality of memory devices 710-1 through 710-5 according to an exemplary embodiment of the inventive concept. Referring to FIG. 7, one (e.g., 710-3) of the memory devices 710-1 through 710-5 may be directly connected with a host to communicate with the host. The memory devices 710-1 through 710-5 include memory controllers 720-1 through 720-5, respectively. The memory devices 710-1 through 710-5 may be connected with each other in a form of a chain. The memory devices 710-1, 710-2, 710-4, and 710-5 that are not directly connected with the host may communicate with the host indirectly through the chain.

The memory controllers 720-1 through 720-5 may be implemented within the memory devices 710-1 through 710-

5, respectively, or may be piled on the memory devices 710-1 through 710-5, respectively, in a stack structure.

Figure 8:
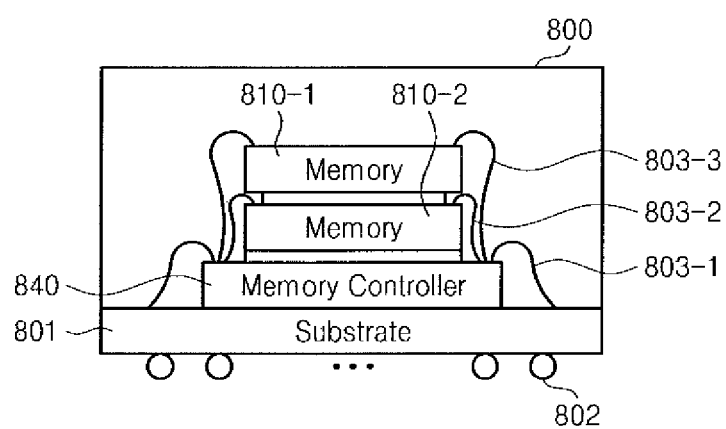
FIG. 8 is a block diagram of a multi-chip package including the memory device illustrated in FIG. 4 according to an exemplary embodiment of the inventive concept.

FIG. 8 is a block diagram of a multi-chip package 800 including the memory device illustrated in FIG. 4 according to an exemplary embodiment of the inventive concept. Referring to FIG. 8, the multi-chip package 800 may include a memory controller 840 which is formed on a circuit board 801, e.g., a printed circuit board (PCB), and a plurality of memory devices 810 (e.g., 810-1, 810-2) which are formed on the memory controller 840. Each of the memory devices 810 may be implemented as the memory device 400 illustrated in FIG. 4. Bonding wires 803-1, or solder balls 802 may be used to electrically connect the memory controller 840 with an external device. And, a plurality of bonding wires 803-2 and 803-3 may be used to electrically connect the memory controller 840 with the plurality of memory devices 810.

FIG. 8 illustrates an exemplary embodiment in which the plurality of memory devices 810 are formed on the memory controller 840. However, positions of the plurality of memory devices 810 and the memory controller 840 may be changed, according to other embodiments.

The memory controller 840 and the plurality of memory devices 810 may also communicate with each other through connecting means besides the plurality of bonding wires 803-2 and 803-3, and, the memory controller 840 may be connected with the solder balls 802 through connecting means besides the plurality of bonding wires 803. The connecting means may be implemented by a vertical electrical element, for example, through a silicon via (TSV).

Figure 9:
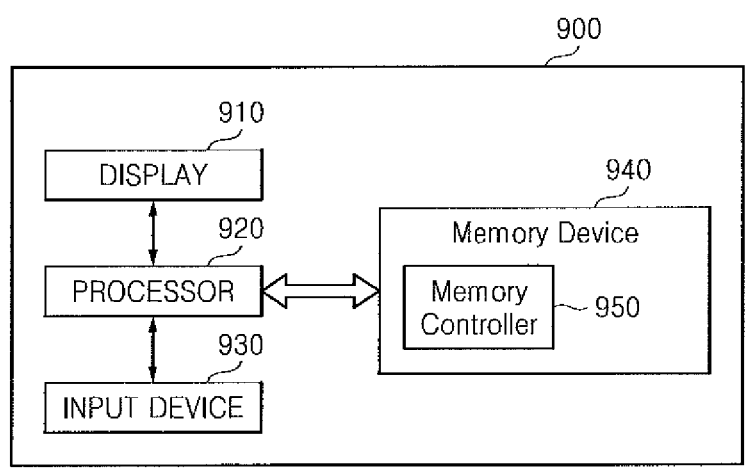
FIG. 9 is a block diagram of a data processing system including the memory device illustrated in FIG. 4 according to an exemplary embodiment of the inventive concept.

FIG. 9 is a block diagram of a data processing system 900 including a display 910, a processor 920, an input device 930, and a memory device 940 according to an exemplary embodiment of the inventive concept. In an exemplary embodiment, the memory device 940 is the same as the memory device illustrated in FIG. 4. Referring to FIG. 9, the data processing system 900 may be implemented as a personal computer (PC), a tablet PC, a net-book, an e-reader, a personal digital assistant (PDA), a portable multimedia player (PMP), an MP3 player, or an MP4 player.

The memory device 940 may include a non-volatile memory device and a memory controller 950 controlling the data processing operations of the non-volatile memory device. The processor 920 may display data stored in the non-volatile memory device through the display 910 according to data input through the input device 930. The input device 930 may be implemented by a pointing device such as a touch pad or a computer mouse, a keypad, or a keyboard.

The memory controller 950 may control data processing operations of the memory device 940. The processor 920 may display data stored in the memory device 940 through the display 910 according to data input through the input device 930.

The processor 920 may control the overall operation of the data processing system 900 and the operations of the memory controller 950. The memory controller 950, which may control the operations of the memory device 940, may be implemented as a part of the memory device 940 or as a stacked form with the memory device 940.

FIG. 10 is a graph showing an output signal OUT against an input voltage in a small signal receiver according to an exemplary embodiment of the inventive concept. Referring to FIG. 10, the output signal OUT is stable even when an input signal IN at a low voltage of about 0.6 V is applied to the small signal receiver according to at least one embodiment of the inventive concept. For example, the widths of the periods of the high and low portions of the output signal OUT due to application of the 1.2V input signal IN could be considered stable and an output signal OUT whose high and/or low portions have periods that significantly deviate from these respective periods could be considered unstable. In another example, an output signal OUT is considered stable if it has well defined transitions or the slope of a transition is relatively vertical and unstable otherwise.

Figure 11A:
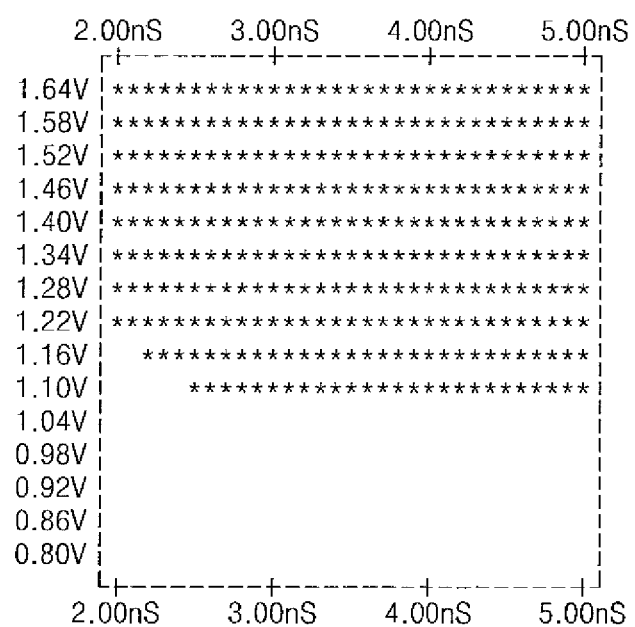
FIG. 11A is a voltage-time graph showing an output signal of a conventional small signal receiver with respect to a voltage applied to the conventional small signal receiver as an input signal.
Figure 11B:
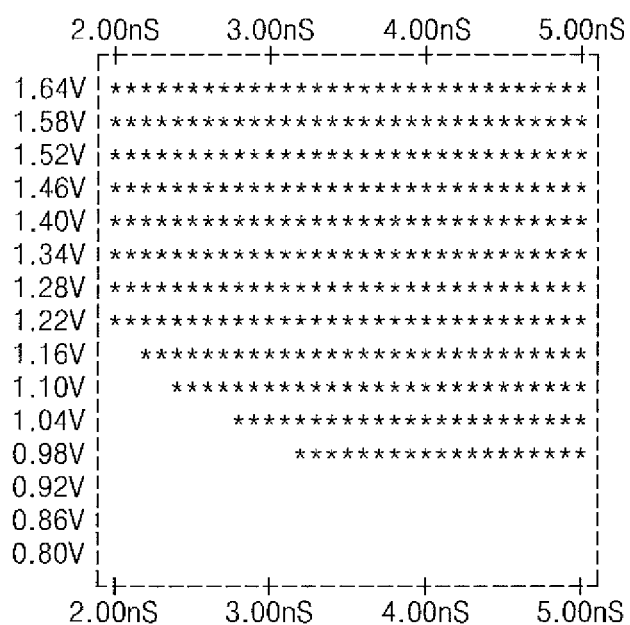
FIG. 11B is a voltage-time graph showing an output signal gated depending on a voltage of an input signal according to an exemplary embodiment of the inventive concept.

FIG. 11A is a voltage-time graph showing an output signal of a conventional small signal receiver with respect to a voltage applied to the conventional small signal receiver as an input signal. FIG. 11B is a voltage-time graph showing an output signal gated depending on a voltage of an input signal according to an exemplary embodiment of the inventive concept.

Referring to FIG. 11A, an output signal denoted by "*" is not stable when an input signal is lower than 1.1 V. However, referring to FIG. 11B, when the input signal is reinforced by a swing stabilizing block connected between an input node and a self-biasing node according to at least one exemplary embodiment of the inventive concept, the output signal "*" provides stable low voltages even when the input signal is as low as 0.98 V.

In at least one exemplary embodiment of the inventive concept, any one of the above-described differential amplifiers may be replaced with an operational amplifier.

As described above, according to at least one embodiment of the inventive concept, a small signal receiver includes a swing stabilizing block at an input terminal of a differential amplifier, which may increase the output swing of the differential amplifier. As a result, the low-voltage interface efficiency of the small signal receiver may be increased.

While the inventive concept has been particularly shown and described with reference to exemplary embodiments thereof, it will be understood that various changes in forms and details may be made therein without departing from the spirit and scope of the inventive concept.

What is claimed is:

1. An integrated circuit comprising:
   a first P-type metal oxide semiconductor (PMOS) transistor configured to be connected between a first power supply voltage terminal and a first node and to provide current in response to a self-bias signal;
   a self-biased differential amplifier configured to be connected between the first node and a second node, to compare an input signal with a reference voltage, to provide the self-bias signal to a self-biasing node, and to output an output signal through an output node; and
   a first N-type metal oxide semiconductor (NMOS) transistor configured to be connected between the second node and a second power supply voltage terminal and to sink current at the second node in response to the self-bias signal,
   wherein the self-biased differential amplifier comprises:
   a plurality of PMOS transistors connected in parallel between the first node and the self-biasing node;
   a plurality of NMOS transistors connected in parallel between the second node and the self-biasing node; and
   a swing stabilizing block configured to be connected between an input node to which the input signal is applied and the self-biasing node, to convert the input signal, and to provide the converted input signal to the self-biasing node.

2. The integrated circuit of claim 1, wherein the swing stabilizing block comprises at least one NMOS transistor that has a source and a drain connected in common to the self-biasing node and is gated with the input signal.

3. The integrated circuit of claim 1, wherein the plurality of PMOS transistors comprise:

a second PMOS transistor connected between the first node and the self-biasing node and gated with the reference voltage applied to a reference node; and a third PMOS transistor connected between the first node and the self-biasing node in parallel with the second PMOS transistor and gated with the self-bias signal, wherein the self-biased differential amplifier comprises:
- a fourth PMOS transistor connected between the first node and the output node and gated with the self-bias signal; and
- a fifth PMOS transistor connected between the first node and the output node in parallel with the fourth PMOS transistor and gated with the input signal received from the input node.

4. The integrated circuit of claim 1, wherein the plurality of NMOS transistors comprise:
- a second NMOS transistor connected between the second node and the self-biasing node and gated with the reference voltage applied to a reference node; and
- a third NMOS transistor connected between the second node and the self-biasing node in parallel with the second NMOS transistor and gated with a signal output from the self-biasing node, wherein the self-biased differential amplifier further comprises:
- a fourth NMOS transistor connected between the second node and the output node and gated with the self-bias signal; and
- a fifth NMOS transistor connected between the second node and the output node in parallel with the fourth NMOS transistor and gated with the input signal.

5. The integrated circuit of claim 1, further comprising a switching circuit configured to be connected between the first NMOS transistor and the second power supply voltage terminal and to turn on or off the self-biased differential amplifier.

6. The integrated circuit of claim 5, wherein the switching circuit is an NMOS transistor gated with an on/off signal.

7. A memory device comprising:
- a control logic configured to output a row address, a column address, and at least one control signal in response to a plurality of signals;
- a memory cell array comprising a plurality of word lines, a plurality of bit lines and a plurality of memory cells each of which is connected to one of the word lines and one of the bit lines and stores data;
- a row decoder configured to decode the row address and to select one of the word lines;
- a column decoder configured to decode the column address and to select at least one of the bit lines;
- a sense amplifier configured to sense and amplify data received from at least one of the memory cells connected between the selected word line and the selected bit line or data to be stored in the memory cell;
- the integrated circuit of claim 1 configured to input or output the data;
- an input buffer configured to receive the data to be stored in the memory cell and to transmit the data to the integrated circuit; and
- an output driver configured to receive the sensed and amplified data from the integrated circuit and to output the sensed and amplified data.

8. An electronic device comprising:
the integrated circuit of claim 1; and
a switch block configured to turn on or off the integrated circuit.

9. A small signal receiver comprising:
- a first transistor connected between a power supply voltage and a first node;
- a first complimentary transistor connected between a ground voltage and a second node;
- a second transistor connected between the first node and a third node;
- a third transistor connected between the first node and a fourth node;
- a second complimentary transistor connected between the third node and the second node and comprising a control terminal connected to a control terminal of the second transistor;
- a third complimentary transistor connected between the fourth node and the second node and comprising a control terminal connected to a control terminal of the third transistor; and
- a swing stabilizing block connected between the third node and the control terminal of the third transistor and configured to stably provide an input signal applied to the control terminal of the third transistor to the third node, wherein a control terminal of the first transistor and a control terminal of the first complimentary transistor are connected to the third node, wherein a reference signal is applied to the control terminal of the second transistor.

10. The small signal receiver of claim 9, wherein the reference signal has a same phase as the input signal.

11. The small signal receiver of claim 9, wherein the reference signal has a phase inverse to the input signal applied to the control terminal of the third transistor.

12. The small signal receiver of claim 9, wherein the swing stabilizing block comprises a transistor that has a source and a drain connected in common to a control terminal of the third transistor and a control terminal connected to the third node.

13. The small signal receiver of claim 9, wherein the swing stabilizing block comprises one of a capacitor and an inductor.

* * * * *